US010032686B2

(12) United States Patent
Okuaki et al.

(10) Patent No.: US 10,032,686 B2
(45) Date of Patent: Jul. 24, 2018

(54) MOTOR DRIVE DEVICE AND METHOD CAPABLE OF NOTIFYING MALFUNCTION IN FLUID FLOW IN HEAT SINK

(71) Applicant: FANUC CORPORATION, Yamanashi (JP)

(72) Inventors: Kenichi Okuaki, Yamanashi (JP); Kazuhiro Yamamoto, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 15/153,806

(22) Filed: May 13, 2016

(65) Prior Publication Data
US 2016/0351041 A1    Dec. 1, 2016

(30) Foreign Application Priority Data

Jun. 1, 2015 (JP) ................................ 2015-111508

(51) Int. Cl.
G08B 17/00 (2006.01)
H01L 23/34 (2006.01)
(Continued)

(52) U.S. Cl.
CPC ................ H01L 23/34 (2013.01); G01K 3/04 (2013.01); G08B 21/182 (2013.01);
(Continued)

(58) Field of Classification Search
CPC .. G08B 21/182; G08B 21/16; B01D 2273/30; B01D 46/0086; G01F 1/68; G01K 3/14;
(Continued)

(56) References Cited

U.S. PATENT DOCUMENTS 6,072,397 A * 6/2000 Ostrowski ............ F24F 11/0001
236/49.2
8,164,434 B2 * 4/2012 Gross ................... G05B 13/048
340/500
(Continued)

FOREIGN PATENT DOCUMENTS

CN       101093409 A    12/2007
CN       101770266 A     7/2010
(Continued)

OTHER PUBLICATIONS

English Abstract and Machine Translation for Japanese Publication No. 2008-202808, published Sep. 4, 2008, 9 pgs.
(Continued)

*Primary Examiner* — Anh V La
(74) *Attorney, Agent, or Firm* — Fredrikson & Byron, P.A.

(57) ABSTRACT

A motor drive device detects the malfunction of a flow path in a heat sink based on the temperature of the device. The motor drive device includes: a temperature detection part which detects the temperature of the motor drive device; a temperature change calculating part which calculates the degree of change of the temperature with respect to time when the rotation number of a fan is controlled to a lower rotation number than a regular rotation number; an malfunction determination part which determines whether or not the degree of the change is different from a predetermined standard; and an malfunction signal generation part which generates a signal indicating that malfunction occurs in fluid flow when it is determined that the degree of the change is different from the standard.

6 Claims, 9 Drawing Sheets

(51) Int. Cl.
  *G08B 21/18* (2006.01)
  *H05K 7/20* (2006.01)
  *G01K 3/04* (2006.01)
  *H01L 23/467* (2006.01)

(52) U.S. Cl.
  CPC ............. *H01L 23/467* (2013.01); *H05K 7/20* (2013.01); *H05K 2201/066* (2013.01)

(58) Field of Classification Search
  CPC .......... G01K 7/427; G01K 3/04; G01K 13/00; G01K 7/00; H01L 23/34; H01L 23/36; H05K 7/20; H05K 2201/066; H05K 7/20136; H05K 1/0203; H05K 7/20909; H05K 7/20554; H05K 7/20781; H05K 7/20818; G01M 13/00
  USPC ..... 340/588, 584, 581, 589, 870.17; 702/45; 236/49.2, 49.3; 62/259.2, 125, 129
  See application file for complete search history.

(56) References Cited

U.S. PATENT DOCUMENTS

| | | | |
|---|---|---|---|
| 8,493,221 B2 * | 7/2013 | Cash | B01D 46/0086 236/49.2 |
| 2010/0011134 A1 | 1/2010 | Brockmann et al. | |
| 2011/0050435 A1 * | 3/2011 | Katayama | G03B 21/16 340/635 |

FOREIGN PATENT DOCUMENTS

| | | |
|---|---|---|
| JP | 2004508797 A | 3/2004 |
| JP | 2004263989 A | 9/2004 |
| JP | 2008202808 A | 9/2008 |
| JP | 2009205240 A | 9/2009 |
| JP | 5088170 B2 | 12/2012 |
| JP | 201345914 A | 3/2013 |
| JP | 201452689 A | 3/2014 |

OTHER PUBLICATIONS

English Abstract and Machine Translation for Japanese Publication No. 2014-052689 A, published Mar. 20, 2014, 13 pgs.
English Abstract and Machine Translation for Japanese Publication No. 2013-045914 A, published Mar. 4, 2013, 7 pgs.
English Abstract and Machine Translation for Japanese Publication No. 2009-205240 A, published Sep. 10, 2009, 9 pgs.
English Abstract and Machine Translation for Japanese Publication No. 2004-263989 A, published Sep. 24, 2004, 9 pgs.
English Abstract and Machine Translation for Japanese Publication No. 2004508797 A, published Mar. 18, 2004, 7 pgs.
English Abstract and Machine Translation for Chinese Publication No. 101093409 A, published Dec. 26, 2007, 9 pgs.
English Abstract and Machine Translation for Chinese Publication No. 101770266 A, published Jul. 7, 2010, 12 pgs.
English Abstract and Machine Translation for Japanese Publication No. 5088170 B2, published Dec. 5, 2012, 9 pgs.

* cited by examiner

MOTOR DRIVE DEVICE AND METHOD CAPABLE OF NOTIFYING MALFUNCTION IN FLUID FLOW IN HEAT SINK

BACKGROUND OF THE INVENTION

1. Field of the Invention

The invention relates to a motor drive device capable of notifying a user of the abnormal flow of a fluid flowing into a heat sink, and to a method for such notification.

2. Description of the Related Art

In order to cool an electronic instrument including a heating element such as a power element, a heat sink which defines a flow path, and a fan for generating airflow in the flow path of the heat sink are mounted on the electronic instrument.

An electronic instrument is known in which the temperature of the electronic instrument is measured, and clogging of a flow path in a heat sink is detected based on the measured temperature (for example, Japanese Laid-open Patent Publication No. 2008-202808).

A motor drive device which drives a motor included in a machine tool or the like may control power supplied to the motor so that the power is allowed to greatly fluctuate in a short time. In this case, the temperature of the motor drive device greatly fluctuates in a short time. Conventionally, it has been difficult to detect malfunction such as clogging of a flow path in a heat sink based on the temperature of a device when, e.g., the temperature of the device greatly fluctuates in a short time.

SUMMARY OF THE INVENTION

In an aspect of the invention, a motor drive device comprises a heat sink including a flow path for a fluid; a fan which causes the fluid to flow in the flow path; a fan controller which controls the rotation number of the fan; and a temperature detection part which detects the temperature of the motor drive device.

The motor drive device further comprises a temperature change calculating part which calculates a degree of change in the temperature with respect to time when the fan controller controls the rotation number of the fan to a lower rotation number than a regular rotation number predetermined as a required value when driving a motor.

The motor drive device further comprises a malfunction determination part which determines whether or not the degree of change calculated by the temperature change calculating part is different from a predetermined standard; and a malfunction signal generation part which generates a signal indicating that a malfunction occurs in the fluid flow in the flow path when the malfunction determination part determines that the degree of change is different from the standard.

As the degree of change, the temperature change calculating part may calculate an amount of change in the temperature within a predetermined period when the rotation number of the fan is controlled to the lower rotation number. The malfunction determination part may determine that the degree of change is different from the standard when the calculated amount of change is less than a predetermined threshold value.

Alternatively, the malfunction determination part may determine that the degree of change is different from the standard when a ratio of the calculated amount of change to a predetermined target value of the amount of change in the temperature is less than a predetermined threshold value.

Alternatively, the malfunction determination part may determine that the degree of change is different from the standard when a difference between the calculated amount of change and the predetermined target value of the amount of change in the temperature is larger than a predetermined threshold value. The motor drive device may further comprise an alarm output part which receives the signal and outputs an alarm to a user.

In another aspect of the invention, a method of notifying a user of a malfunction in a fluid flow in a flow path formed at a heat sink provided in a motor drive device, comprises controlling a rotation number of a fan which causes a fluid to flow in the flow path to a lower rotation number than a regular rotation number predetermined as a required value when driving a motor; and detecting a temperature of the motor drive device.

The method further comprises calculating a degree of change in the temperature with respect to time when the rotation number of the fan is controlled to the lower rotation number; determining whether or not the calculated degree of change is different from a predetermined standard; and notifying a user that a malfunction occurs in the fluid flow in the flow path when it is determined that the degree of change is different from the standard.

BRIEF DESCRIPTION OF THE DRAWINGS

The above-described or other objects, features, and advantages of the invention will be further clarified by describing the following embodiments with reference to accompanying drawings, in which.

DETAILED DESCRIPTION

Embodiments of the invention will be described in detail below with reference to the drawings. First, a motor drive device 10 according to an embodiment of the invention will be described with reference to FIG. 1 to FIG. 4. In order to drive a main motor (not illustrated) included in e.g. a machine tool, the motor drive device 10 supplies electric power to the main motor.

Figure 1:
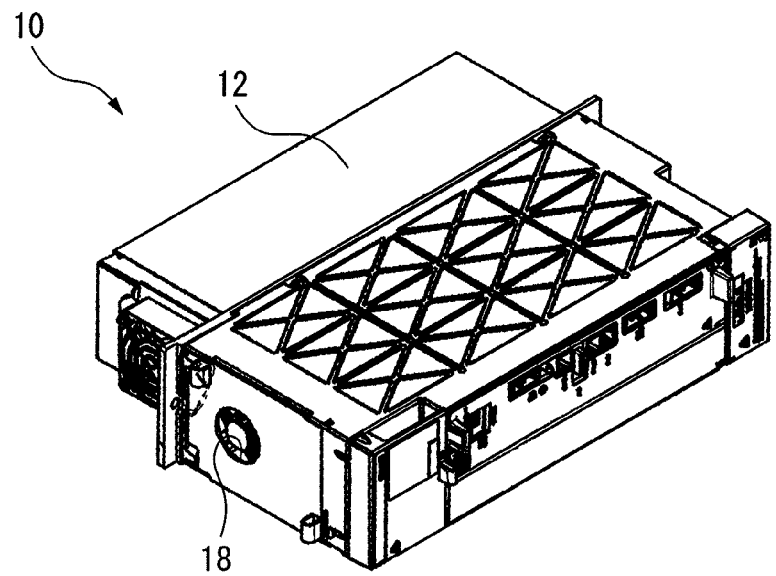
FIG. 1 is a perspective view of a motor drive device according to an embodiment of the invention.
Figure 2:
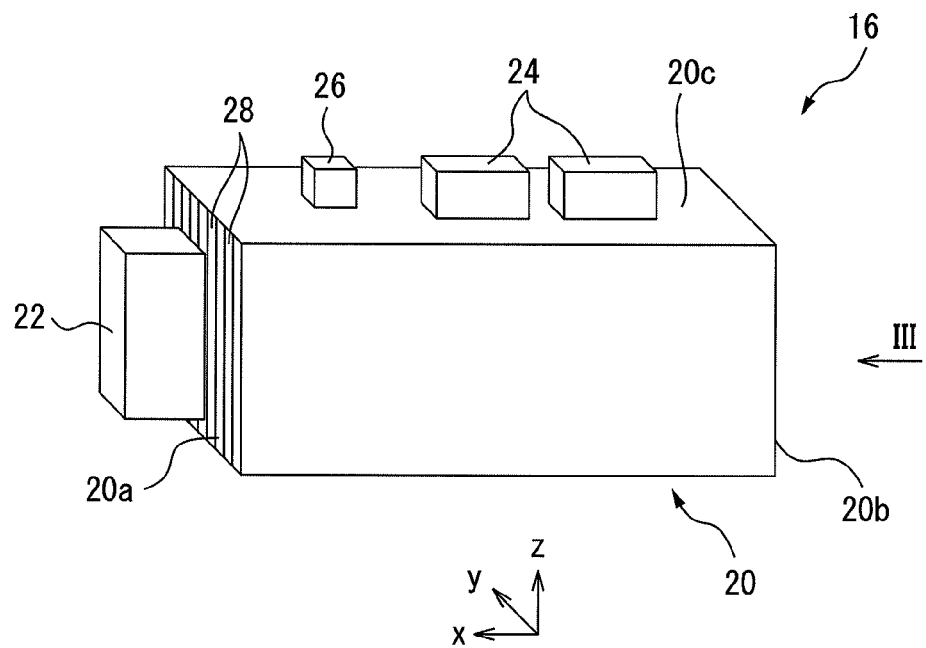
FIG. 2 is a perspective view of a heat sink assembly included in the motor drive device illustrated in FIG. 1.
Figure 3:
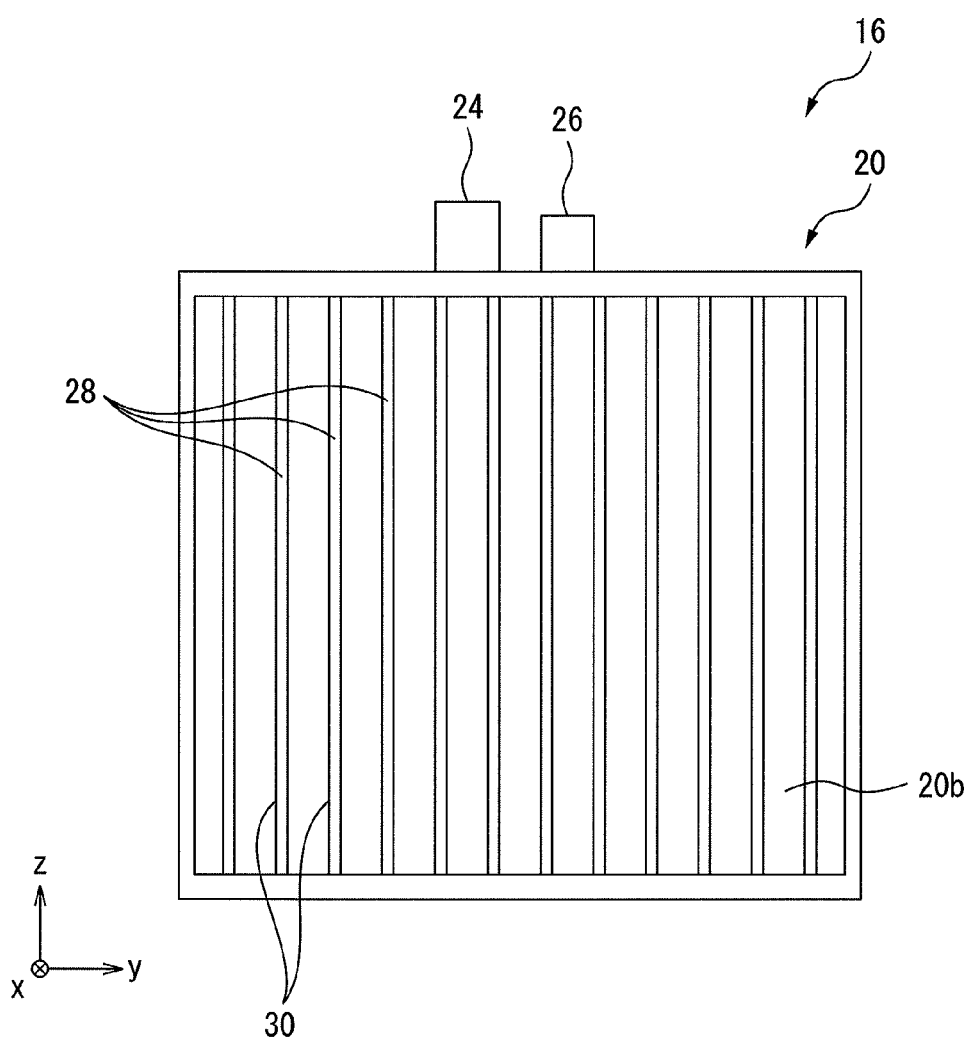
FIG. 3 is a view of the heat sink assembly illustrated in FIG. 2 as viewed from a direction indicated by an arrow III in FIG. 2.

The motor drive device 10 includes a housing 12, a controller 14 (FIG. 4), and a heat sink assembly 16 (FIG. 2 and FIG. 3). The housing 12 is a box member made of e.g. metal, and defines an internal space. A through-hole 18 is formed at the housing 12.

The controller 14 includes e.g. a CPU, and is housed in the internal space of the housing 12. The controller 14 directly or indirectly controls each component of the motor drive device 10.

The heat sink assembly 16 is placed in the internal space of the housing 12. As illustrated in FIG. 2 and FIG. 3, the heat sink assembly 16 includes a heat sink 20, a fan 22, a heating element 24, and a temperature detection part 26.

The heat sink 20 is, for example, a rectangular parallelepiped member having a longitudinal direction along the x-axis direction in the Cartesian coordinate system in FIG. 2 and FIG. 3, and includes a first end 20a in the x-axis direction, and a second end 20b opposite the first end 20a.

The heat sink 20 includes a plurality of radiation fins 28. Each of the radiation fins 28 is a plate member having a predetermined length in the x-axis direction, thickness in the y-axis direction and width in the z-axis direction, and extends between the first end 20a and the second end 20b. The radiation fins 28 are arranged to align in the y-axis direction at substantially equal intervals.

A flow path 30 is defined between two radiation fins 28 adjacent to each other in the y-axis direction. Each flow path 30 extends in the x-axis direction between the first end 20a and the second end 20b, and opens to the outside at each of the first end 20a and the second end 20b.

The fan 22 is mounted on the first end 20a of the heat sink 20. The fan 22 includes a rotor 32 (FIG. 4) having a plurality of vanes, and a fan motor 34 (FIG. 4) which rotates the rotor 32.

Figure 4:
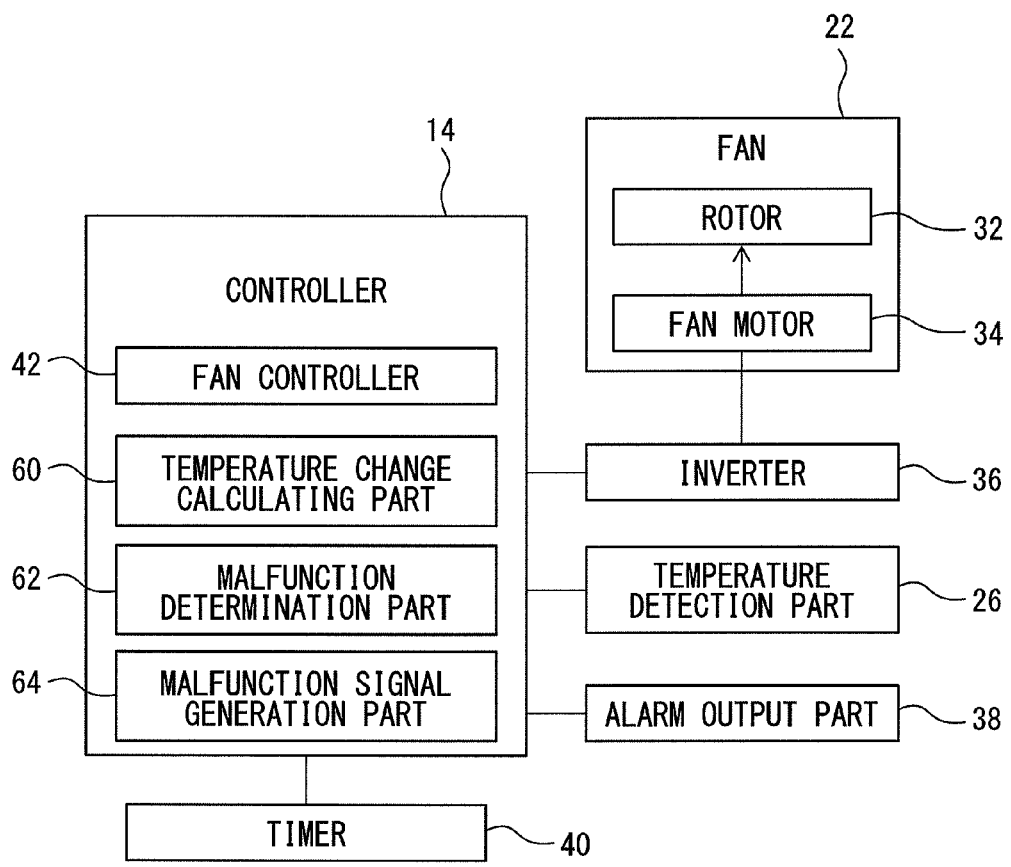
FIG. 4 is a block diagram of the motor drive device illustrated in FIG. 1.

The rotor 32 is arranged to adjoin the through-hole 18 formed at the housing 12. The fan motor 34 is connected to an inverter 36 (FIG. 4). The inverter 36 supplies electric power to the fan motor 34 in accordance with a command from the controller 14. The fan motor 34 rotates the rotor 32 at a rotation number corresponding to the electric power supplied by the inverter 36.

When the rotor 32 is rotated, airflow toward the x-axis positive direction in FIG. 2 is generated in the flow paths 30, for example. In this case, outside air flows into the openings of the flow paths 30 at the second end 20b, flows in the flow paths 30 in the x-axis positive direction, and flows out from the openings of the flow paths 30 at the first end 20a.

Then, the air is discharged from the through-hole 18 of the housing 12 to the outside. Due to the air flowing in the flow paths 30 in such a manner, the heat sink 20 is cooled, thereby the motor drive device 10 is cooled.

In this embodiment, the heating element 24 and the temperature detection part 26 are placed on an outer surface 20c of the heat sink 20. The heating element 24 includes a power element, etc., and generates electric power in accordance with a command from the controller 12. The controller 12 supplies the electric power generated by the heating element 24 to the main motor of the machine tool or the like, so as to drive the main motor.

The temperature detection part 26 includes a temperature sensor, and measures temperature at a position where the temperature detection part 26 is placed, in accordance with a command from the controller 12. The temperature detection part 26 sends data of the measured temperature to the controller 12.

The motor drive device 10 further includes an alarm output part 38 and a timer 40 (FIG. 4). The alarm output part 38 includes e.g. a speaker or a display, and outputs a sound wave or an image in accordance with a command from the controller 14. The timer 40 clocks an elapsed time from a certain time point, in accordance with a command from the controller 14.

As the fan 22 is operated for cooling motor drive device 10 so as to cause the air to flow in the flow paths 30, foreign substances such as dust may enter from the outside into the flow paths 30 so as to be accumulated therein, and thereby the flow paths 30 is clogged by the foreign substances.

In this case, airflow in the flow paths 30 is obstructed, and the airflow in the flow paths 30 is abnormally decreased. As a result, the cooling performance of the heat sink 20 may be deteriorated, and thereby causing overheat of the motor drive device 10. In order to prevent such a situation, a user should do maintenance for appropriately removing the foreign substances accumulated in the flow paths 30.

The motor drive device 10 according to this embodiment detects whether or not a malfunction occurs in airflow in the flow paths 30 of the heat sink 20, based on a degree of change in the temperature measured by the temperature detection part 26 with respect to time.

Figure 5:
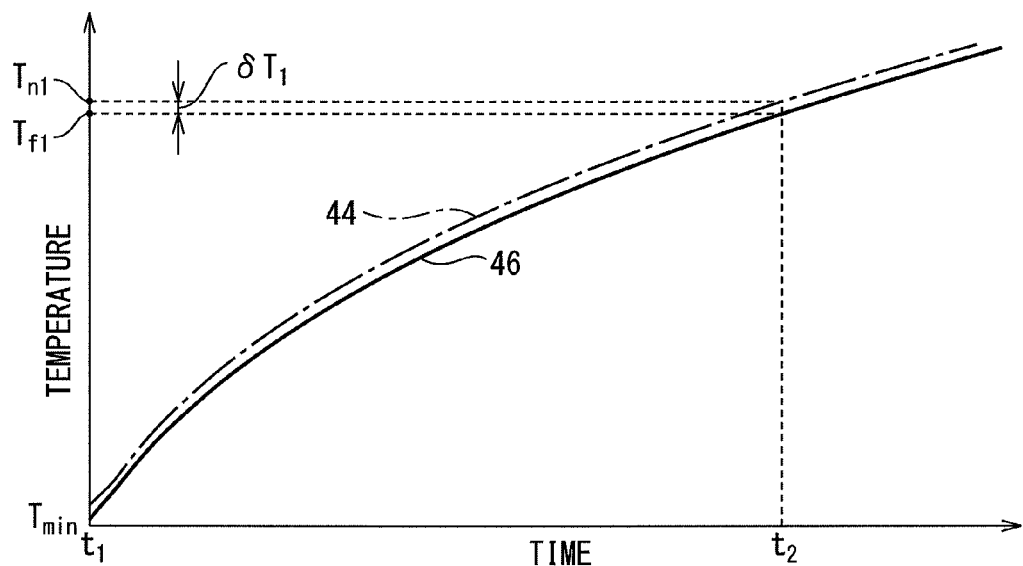
FIG. 5 is a graph showing a relationship between temperature and time when the fan is driven at a regular rotation number, and the temperature increases.
Figure 6:
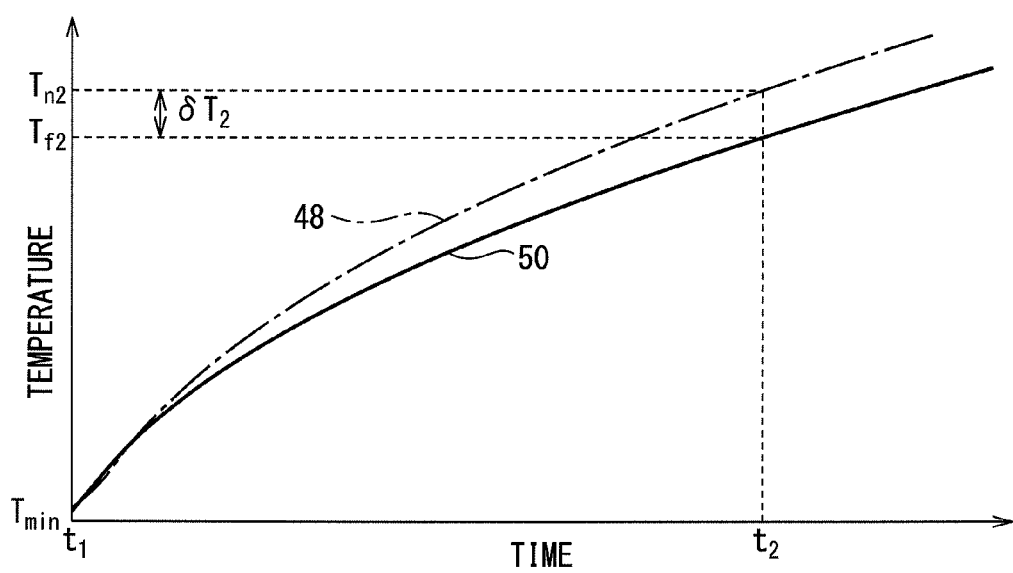
FIG. 6 is a graph showing a relationship between temperature and time when the fan is driven at a lower rotation number than the regular rotation number, and the temperature increases.

Such operation will be described with reference to FIG. 5 to FIG. 8. FIG. 5 is a graph showing a relationship between temperature measured by the temperature detection part 26 and time when the fan 22 is driven at a regular rotation number $R_{Reg}$. FIG. 6 is a graph showing a relationship between temperature and time when the fan 22 is driven at a lower rotation number $R_{Low}$ than the regular rotation number $R_{Reg}$.

Here, the regular rotation number $R_{Reg}$ is predetermined as a required value for normally operating the fan 22 in order to cool the motor drive device 10 when the motor drive device 10 drives the main motor in a machine tool or the like. For example, the fan 22 is driven at the regular rotation number $R_{Reg}$ when the motor drive device 10 supplies electric power to the main motor.

Note that, FIG. 5 and FIG. 6 indicate characteristics in a case where the temperature of the motor drive device 10 increases rapidly, for example, in a case where the motor drive device 10 starts to supply electric power to the main motor, thereby the temperature of the heating element 24 increases rapidly.

A chain line 44 in FIG. 5 and a chain line 48 in FIG. 6 indicate characteristics of a case in which no foreign substance accumulates in the flow paths 30 of the heat sink 20 (hereinafter, referred as a "normal product"). On the other hand, a solid line 46 in FIG. 5 and a solid line 50 in FIG. 6 indicate characteristics of a case in which foreign substances accumulate in the flow paths 30 of the heat sink 20, thereby airflow in the flow path 30 is obstructed (hereinafter, referred as a "malfunction product").

As shown in FIG. 5, when the fan 22 is driven at the regular rotation number $R_{Reg}$, the temperature in the normal product increases from $T_{min}$ to $T_{n1}$ within a period from a time point $t_1$ to time point $t_2$. On the other hand, the temperature in the malfunction product increases from $T_{min}$ to $T_{f1}$ ($<T_{n1}$) within the period from the time point $t_1$ to time point $t_2$.

As seen from FIG. 5, when the fan 22 is driven at the regular rotation number $R_{Reg}$, there is no significant difference between the time-temperature characteristics of the normal product and the malfunction product. Specifically, the difference $\delta T_1$ between the temperature $T_{n1}$ of the normal product and the temperature $T_{f1}$ of the malfunction product at the time point $t_2$ is very small. Further, there is no significant difference between the gradient (i.e., time derivative coefficient) of the time-temperature characteristic of the normal product and the gradient of the time-temperature characteristic of the malfunction product.

On the other hand, as shown in FIG. 6, when the fan 22 is driven at the rotation number $R_{Low}$, the temperature in the normal product increases from $T_{min}$ to $T_{n2}$ within a period from the time point $t_1$ to time point $t_2$. On the other hand, the temperature in the malfunction product increases from $T_{min}$ to $T_{f2}$ within the period from the time point $t_1$ to time point $t_2$.

As seen from the graph illustrated in FIG. 6, when the fan 22 is driven at the rotation number $R_{Low}$, there is a significant difference between the time-temperature characteristics of the normal product and the malfunction product, if compared with that in FIG. 5.

Specifically, the difference $\delta T_2$ between the temperatures of the normal product and the malfunction product at the time point $t_2$ is significantly larger than $\delta T_1$. Further, the gradient of the time-temperature characteristic of the normal product is significantly greater than that of the malfunction product.

Note that, in a cooling structure in which the heat sink 20 is forcibly cooled by air by the fan 22 as in this embodiment, when the temperature of the motor drive device 10 increases, the temperature of the normal product in which airflow in the flow paths 30 is normal increases to reach a saturation temperature more rapidly (i.e., the gradient is greater) than the malfunction product in which airflow in the flow paths 30 is obstructed. Therefore, when the temperature increases, the amount of increase in the temperature within the period from the time point $t_1$ to time point $t_2$ in the normal product is larger than that in the malfunction product, as shown in FIG. 6.

Figure 7:
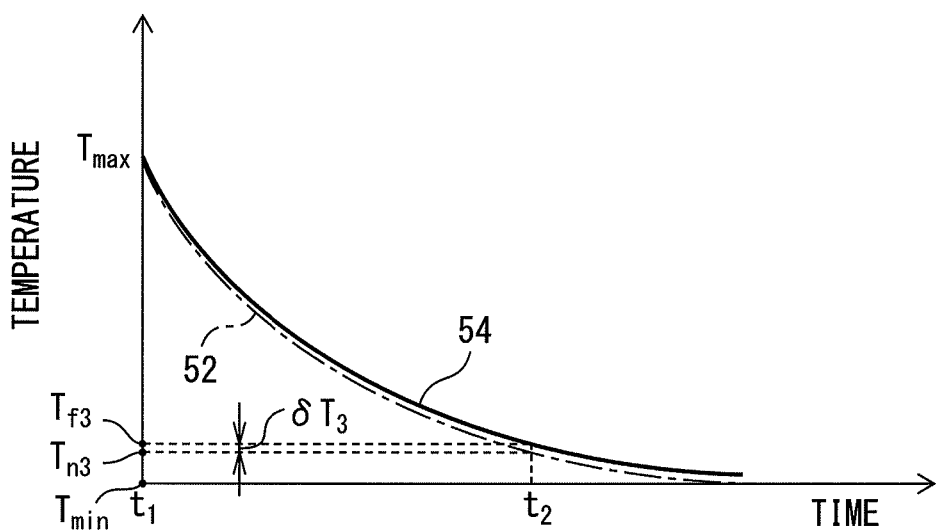
FIG. 7 is a graph showing a relationship between temperature and time when the fan is driven at the regular rotation number, and the temperature decreases.
Figure 8:
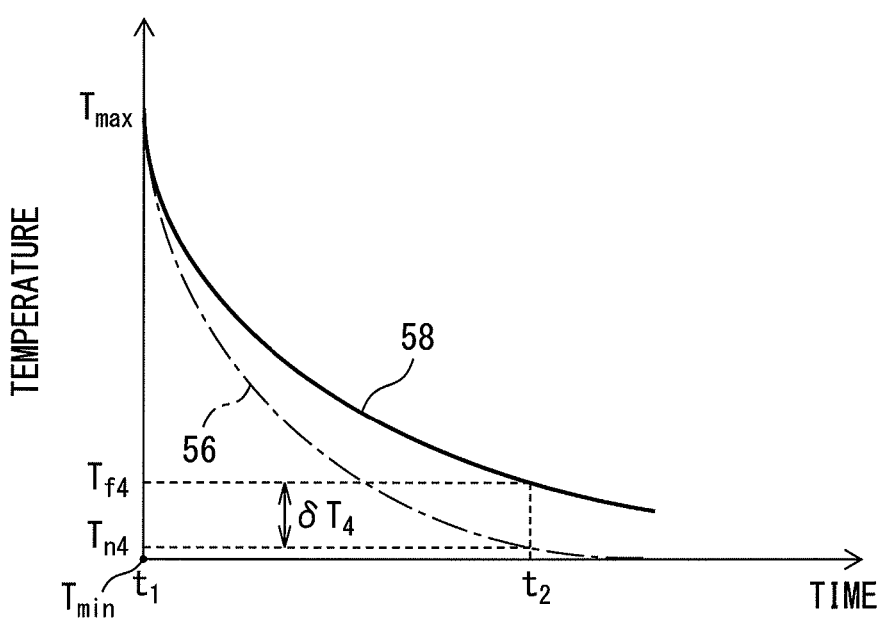
FIG. 8 is a graph showing a relationship between temperature and time when the fan is driven at the lower rotation number than the regular rotation number, and the temperature decreases.

On the other hand, FIG. 7 and FIG. 8 indicate characteristics of a case in which the temperature of the motor drive device 10 decreases rapidly, for example, a case in which the motor drive device 10 stops supply of electric power to the main motor of a machine tool or the like, thereby the temperature of the heating element 24 decreases rapidly.

FIG. 7 is a graph showing a relationship between temperature and time when the fan 22 is driven at the regular rotation number $R_{Reg}$. FIG. 8 is a graph showing a relationship between temperature and time when the fan 22 is driven at the lower rotation number $R_{Low}$ than the regular rotation number $R_{Reg}$. A chain line 52 in FIG. 7 and chain line 56 in FIG. 8 indicate the characteristics of the normal product. On the other hand, a solid line 54 in FIG. 7 and solid line 58 in FIG. 8 indicate the characteristics of the malfunction product.

As shown in FIG. 7, when the fan 22 is driven at the regular rotation number $R_{Reg}$, the temperature in the normal product decreases from $T_{max}$ to $T_{n3}$ within the period from the time point $t_1$ to time point $t_2$. On the other hand, the temperature in the malfunction product decreases from $T_{max}$ to $T_{f3}$ within the period from the time point $t_1$ to time point $t_2$.

There is no significant difference between the time-temperature characteristics of the normal product and the malfunction product when the fan 22 is driven at the regular rotation number $R_{Reg}$. Specifically, the difference $\delta T_3$ between the temperatures of the normal product and the malfunction product at the time point $t_2$ is very small. Further, there is no significant difference between the gradient of the time-temperature characteristic of the normal product and the gradient of the time-temperature characteristic of the malfunction product.

As shown in FIG. 8, when the fan 22 is driven at the rotation number $R_{Low}$, the temperature in the normal product decreases from $T_{max}$ to $T_{n4}$ within the period from the time point $t_1$ to time point $t_2$. On the other hand, the temperature in the malfunction product decreases from $T_{max}$ to $T_{f4}$ within in the period from the time point $t_1$ to time point $t_2$.

As seen from the graph illustrated in FIG. 8, when the fan 22 is driven at the rotation number $R_{Low}$, there is a significant difference between the time-temperature characteristics of the normal product and the malfunction product, if compared with that in FIG. 7.

Specifically, the difference $\delta T_4$ between the temperatures of the normal product and the malfunction product at the time point $t_2$ is significantly larger than $\delta T_3$. Further, the gradient of the time-temperature characteristic of the normal product is significantly greater than that of the malfunction product.

Note that, in a cooling structure in which the heat sink 20 is forcibly cooled by air by the fan 22, when the temperature of the motor drive device 10 decreases, the temperature of the normal product in which airflow in the flow paths 30 is normal decreases to reach a saturation temperature more rapidly (i.e., the absolute value of the gradient is greater) than the malfunction product in which airflow in the flow paths 30 is obstructed. Therefore, when the temperature decreases, the amount of decrease in the temperature within the period from the time point $t_1$ to time point $t_2$ in the normal product is larger than that in the malfunction product, as indicated in FIG. 8.

As described above, when the temperature of the heat sink 20 changes rapidly, it is clear that the difference between the time-temperature characteristics of the normal product and the malfunction product gets significantly larger if the rotation number of the fan 22 is lowered.

In view of this, the motor drive device 10 according to this embodiment drives the fan 22 at the rotation number $R_{Low}$ lower than the regular rotation number $R_{Reg}$, and detects whether a malfunction occurs in airflow in the flow paths 30 of the heat sink 20, based on the degree of the change in the temperature with respect to the time.

Figure 9:
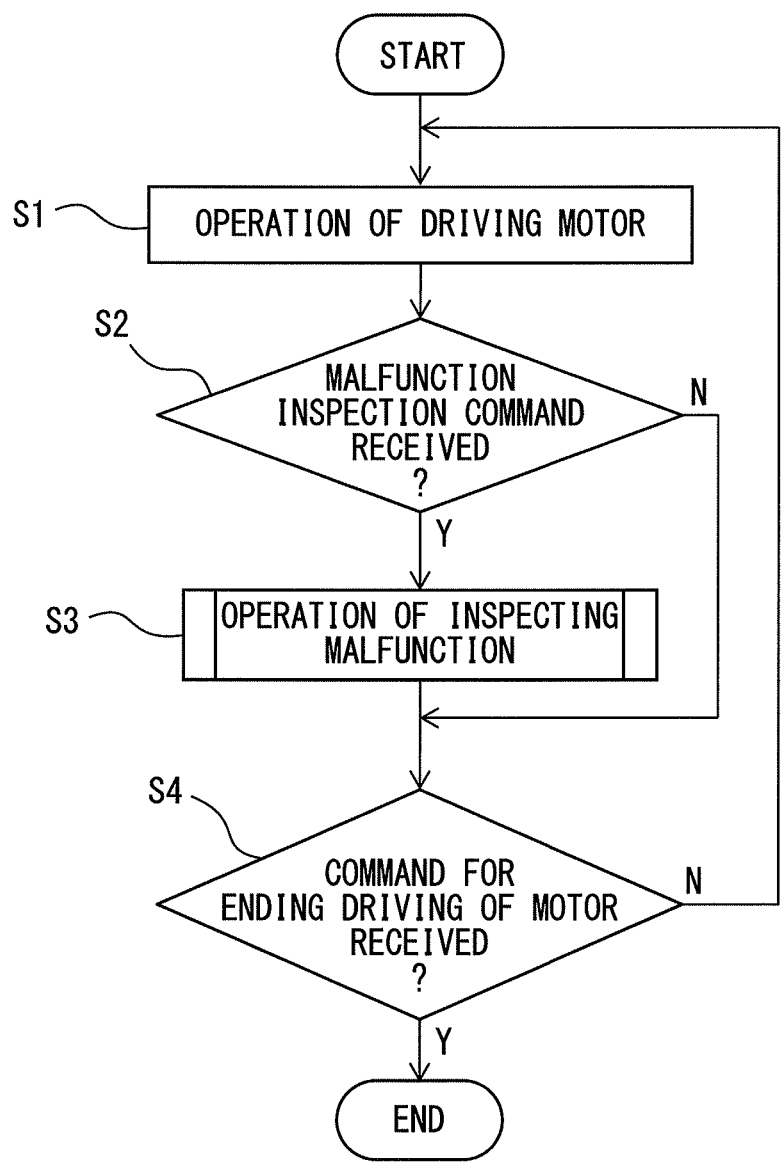
FIG. 9 is a flowchart representing an example of the operation flow of the motor drive device illustrated in FIG. 1.

Next, the operation flow of the motor drive device 10 will be described with reference to FIG. 9 and FIG. 10. For example, the flow shown in FIG. 9 is started when the controller 14 receives a motor drive command for driving the main motor built in a machine tool or the like, from a user or a host controller (e.g., a machine tool controller).

At step S1, the controller 14 executes driving the main motor of the machine tool or the like. Specifically, the controller 14 communicates with the host controller, and appropriately supplies electric power generated by the heating element 24 to the main motor so as to drive the main motor. At step S1, the machine tool executes a process on a workpiece according to a working program or the like.

At step S2, the controller 14 determines whether it has received a malfunction inspection command for inspecting abnormal airflow in the flow paths 30 of the heat sink 20, from the user or the host controller.

As an example, the malfunction inspection command is transmitted from the host controller or the like to the controller 14 at the time when the supply of a regular electric power to the main motor is started at step S1. For example, the regular electric power is required when the machine tool actually processes the workpiece. If the supply of the regular electric power from the motor drive device 10 to the main motor is started, the temperature measured by the temperature detection part 26 increases as shown in FIG. 6.

When the controller 14 determines that it has received the malfunction inspection command (i.e., determines "YES"), the controller 14 proceeds to step S3. On the other hand, when the controller 14 determines that it has not received the malfunction inspection command (i.e., determines "NO"), the controller 14 proceeds to step S4.

At step S3, the controller 14 executes inspecting malfunction of airflow in the flow paths 30 of the heat sink 20. Step S3 will be described with reference to FIG. 10.

Figure 10:
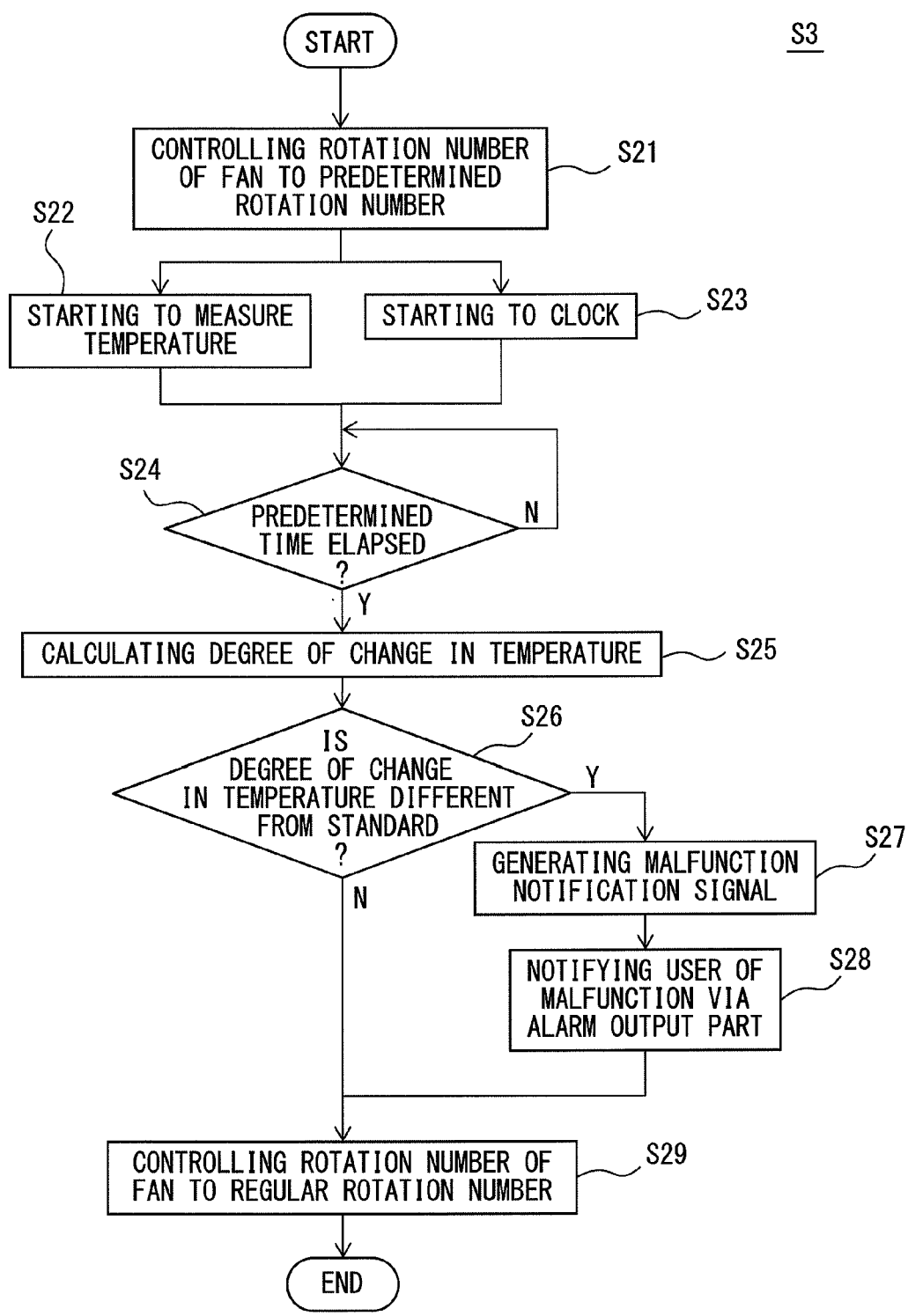
FIG. 10 is a flowchart representing an example of the flow of step S3 in FIG. 9.

After the flow shown in FIG. 10 is started, at step S21, the controller 14 controls the rotation number of the fan 22 to the predetermined rotation number $R_{Low}$. Specifically, the controller 14 sends a command to the inverter 36 so as to control the electric power supplied from the inverter 36 to the fan motor 30 so that the rotation number of the rotor 32 is the rotation number $R_{Low}$.

Thus, in this embodiment, the controller 14 has a function of a fan controller 42 (FIG. 4) which controls the rotation number of the fan 22. The rotation number $R_{Low}$ is set to e.g. 20%-30% of the regular rotation number $R_{Reg}$. Alternatively, the rotation number $R_{Low}$ may be set to zero (i.e., the rotor 32 is stopped).

At step S22, the controller 14 starts to measure the temperature of the motor drive device 10. Specifically, the controller 14 sends a command to the temperature detection part 26 so as to measure the temperature of the outer surface 20c of the heat sink 20 with a predetermined cycle A (e.g., 0.1 second).

The temperature detection part 26 sends data of the measured temperature to the controller 14. The controller 14 stores the data of the temperature, acquired from the temperature detection part 26 in a storage (not illustrated). The storage part may be included in the controller 14.

Concurrently with step S22, at step S23, the controller 14 sends a command to the timer 40 so as to start to clock the elapsed time.

At step S24, the controller 14 determines whether the elapsed time clocked by the timer 40 has been a predetermined time τ (e.g., 5 seconds). When the controller 14 determines that the predetermined time τ has elapsed (i.e., determines "YES"), it proceeds to step S25. On the other hand, when the controller 14 determines that the predetermined time τ has not elapsed (i.e., determines "NO"), it loops step S24.

At step S25, the controller 14 calculates the degree of change in temperature with respect to time. As an example, the controller 14 reads out from the storage part a first-acquired temperature $T_1$ among the temperatures which have been acquired from the temperature detection part 26 with the cycle A after the time point of the start of step S22 (i.e., the time point of the start of step S23).

Further, the controller 14 reads out from the storage part a temperature $T_n$ acquired just before or after the time point when determined "YES" at step S24. Then, the controller 14 calculates a difference $\Delta T_n$ between the temperature $T_1$ and the temperature $T_n$ (i.e., $\Delta T_n = T_n - T_1$). The difference $\Delta T_n$ corresponds to the amount of increase in the temperature within the time τ.

In another example, at this step S25, the controller 14 calculates a value corresponding to the gradient (i.e., the time derivative coefficient) of the characteristic indicated by the solid line 50 in FIG. 6. Specifically, the controller 14 reads out from the storage part the temperature $T_n$ acquired just before or after the time point when determined "YES" at step S24, and a temperature $T_{n-1}$ acquired just before the temperature $T_n$ (i.e., before the temperature $T_n$ by the cycle A (e.g. 0.1 second)). Then, the controller 14 calculates a gradient $\delta T/\delta t = (T_n - T_{n-1})/A$.

Thus, in this embodiment, the controller 14 has a function of a temperature change calculating part 60 (FIG. 4) which calculates the degree of change in the temperature with respect to time when the controller 14 controls the rotation number of the fan 22 to the rotation number $R_{Low}$.

At step S26, the controller 14 determines whether the degree of change in the temperature with respect to time, which has been calculated at step S25, is different from a predetermined standard. As an example, if the above-mentioned difference $\Delta T_n$ is calculated at step S25, the amount of increase in the temperature at the time point $t_2$ ($=t_1 + \tau$) of the characteristic of the normal product indicated by the chain line 48 in FIG. 6, i.e., the value: $\Delta T_{Ref} = T_{n2} - T_{min}$, is pre-stored as a target value in the storage part.

The controller 14 calculates a ratio $R_1$ of the difference $\Delta T_n$ to the target value $\Delta T_{Ref}$, i.e., $R_1 = \Delta T_n / \Delta T_{Ref}$, and determines whether the ratio $R_1$ is less than a predetermined first threshold value (e.g., 0.8). The target value $\Delta T_{Ref}$ and the first threshold value can be obtained in advance by e.g. an experimental method or a simulation.

When the ratio $R_1$ is less than the first threshold value, the controller 14 determines that the degree of change in the temperature with respect to time is different from the degree of change of the normal product as the standard, as in the case of the characteristic indicated by the solid line 50 in FIG. 6.

In another example, the controller 14 calculates a difference $\delta T_n$ between the difference $\Delta T_n$ and the target value $\Delta T_{Ref}$, i.e., $\delta T_n = \Delta T_{Ref} - \Delta T_n$, and determines whether the difference $\delta T_n$ is more than a predetermined second threshold value (e.g., 10° C.). The difference $\delta T_n$ is a value corresponding to $\delta T_2$ indicated in FIG. 6.

When the difference $\delta T_n$ is more than the second threshold value, the controller 14 determines that the degree of change in the temperature with respect to time is different from the degree of change of the normal product as the standard, as in the case of the characteristic indicated by the solid line 50 in FIG. 6.

In still another example, the controller 14 may determine whether the above-mentioned difference $\Delta T_n$ is less than a predetermined third threshold value. In this case, the third threshold value is predetermined (e.g., temperature of $\Delta T_{Ref} \times 0.8$) based on the target value $\Delta T_{Ref}$ (i.e., the characteristic of chain line 48 in FIG. 6), and is stored in the storage part.

In still another example, if the gradient $\delta T/\delta t$ is calculated at step S25, a fourth threshold value for the gradient $\delta T/\delta t$ is pre-stored in the storage part. The fourth threshold value is set based on the gradient of the characteristic of the normal product as indicated by the chain line 48 in FIG. 6, and can be obtained in advance by an experimental method or a simulation.

When the gradient $\delta T/\delta t$ is less than the fourth threshold value, the controller 14 determines that the degree of change in the temperature with respect to time is different from the degree of change of the normal product as the standard, as in the case of the characteristic indicated by the solid line 50 in FIG. 6.

Thus, in this embodiment, the controller 14 functions as a malfunction determination part 62 (FIG. 4) which determines whether or not the degree of change in the temperature with respect to time, which has been calculated at step S25, is different from the standard.

When the controller 14 determines that the degree of change in the temperature with respect to time is different from the standard (i.e., determines "YES"), it proceeds to step S27. On the other hand, when the controller 14 determines that the degree of change in the temperature with respect to time is the same as the standard (i.e., determines "NO"), it proceeds to step S29.

At step S27, the controller 14 generates a malfunction notification signal which indicates that a malfunction occurs in the fluid flow in the flow paths 30 of the heat sink 20. As an example, the controller 14 generates the malfunction notification signal in the form of an audio signal of a warning sound output to a user.

In another example, the controller 14 generates a malfunction notification signal in the form of an image signal of a warning image that can be viewed by a user. Thus, in this embodiment, the controller 14 has a function of a malfunction signal generation part 64 (FIG. 4) which generates the malfunction notification signal.

At step S28, the controller 14 notifies the user via the alarm output part 38 that abnormal airflow occurs in the flow paths 30. As an example, if the audio signal of the warning sound has been generated at step S27, the controller 14 transmits the audio signal to the alarm output part 38. In this case, the alarm output part 38 includes a speaker, and outputs the received audio signal of the warning sound.

In another example, if the image signal of the warning image has been generated at step S27, the controller 14 transmits the image signal to the alarm output part 38. In this case, the alarm output part 38 includes a display, and displays the warning image on the display in accordance with the received image signal.

In this way, the user can recognize the occurrence of the abnormal airflow in the flow paths 30 of the heat sink 20 from the warning sound or the warning image. As a result, the user can recognize that it is necessary to do maintenance for removing foreign substances in the flow paths 30 of the heat sink 20.

At step S29, the controller 14 controls the rotation number of the fan 22 to be increased from the rotation number $R_{Low}$ to the regular rotation number $R_{Reg}$. Specifically, the controller 14 sends a command to the inverter 36, and controls power supplied from the inverter 36 to the fan motor 30 so that the rotation number of the rotor 32 is changed from the rotation number $R_{Low}$ to the regular rotation number $R_{Reg}$. Then, the controller 14 ends the flow shown in FIG. 10.

Referring again to FIG. 9, at step S4, the controller 14 determines whether it has received a command for ending the driving of the main motor in a machine tool or the like, from the user or the host controller.

When the controller 14 determines that it has received the command for ending the driving of the main motor (i.e., determines "YES"), the controller 14 stops the supply of electric power to the main motor, and ends the flow shown in FIG. 9. On the other hand, when the controller 14 determines that it has not received the command for ending the driving of the main motor (i.e., determines "NO"), the controller 14 returns to step S1.

Figure 11:
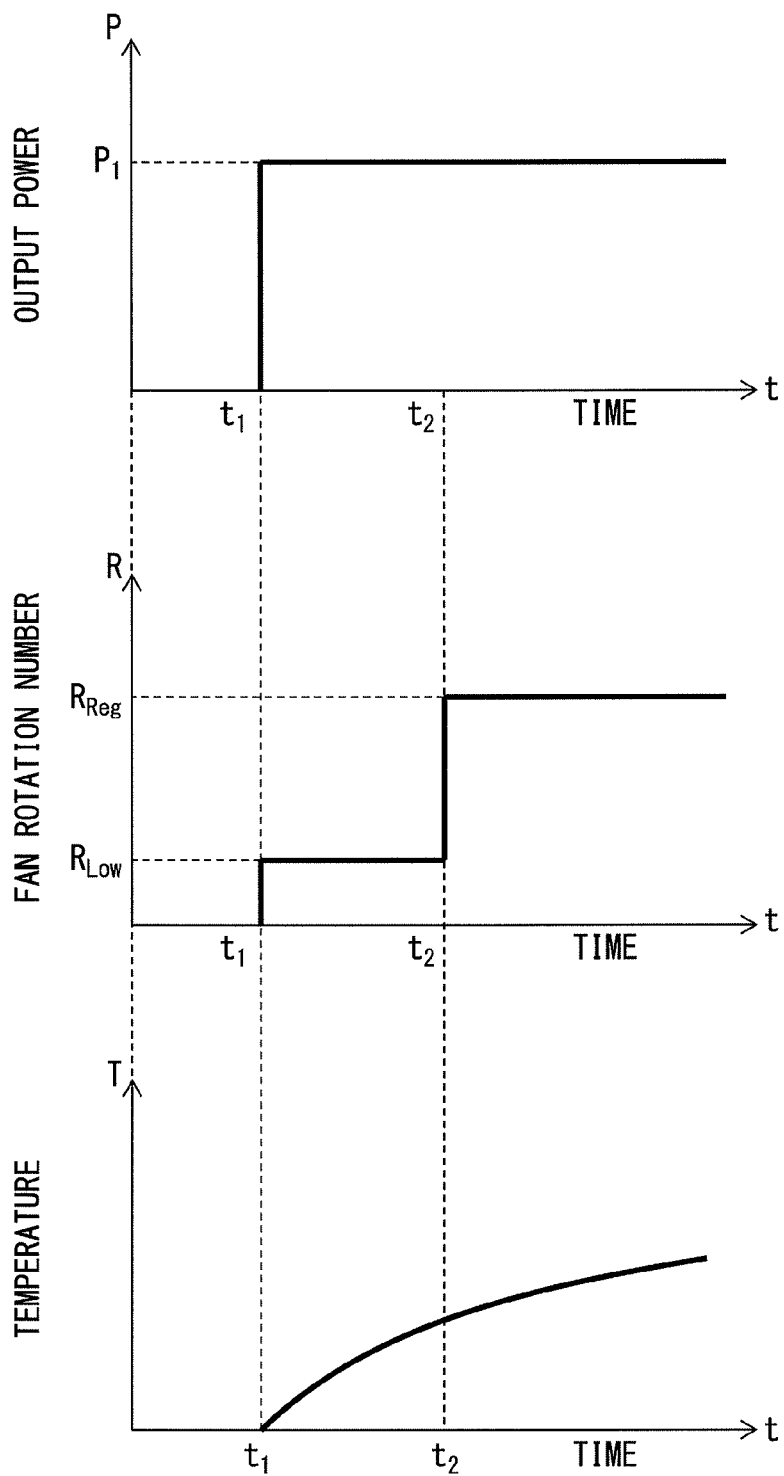
FIG. 11 is a timing chart of the output power of the motor drive device, the rotation number of the fan, and the temperature change, when executing the operation flow according to an example.

The timing chart of each of output power P from the motor drive device 10 to the main motor, the rotation number R of the fan 22, and the temperature T measured by the temperature detection part 26 in the operation flow of this embodiment is shown in FIG. 11.

At the time point $t_1$, the controller 14 starts supply of regular electric power to the main motor, thereby the output power P of the motor drive device 10 is increased to regular electric power $P_1$. At this time, the malfunction inspection command is transmitted to the controller 14, and the controller 14 increases the rotation number of the fan 22 from zero to the rotation number $R_{Low}$ (step S21). After the time point $t_1$, the temperature measured by the temperature detection part 26 increases.

Then, at the time point $t_2$, the controller 14 increases the rotation number of fan 22 from the rotation number $R_{Low}$ to the regular rotation number $R_{Reg}$ (step S29). The controller 14 carries out step S1 until it determines "YES" at step S4.

In the operation flow of the above-mentioned embodiment, the malfunction inspection command is transmitted in step S2 at the time when the supply of the regular electric power to the main motor is started. However, the malfunction inspection command may be transmitted at the time when the electric power supplied from the motor drive device 10 to the main motor is changed from the regular electric power to lower power (e.g., zero) than the regular electric power in the process of driving the main motor at step S1.

In this case, the controller 14 drives the fan 22 to rotate at the regular rotation number $R_{Reg}$ at the time when the malfunction inspection command is transmitted (i.e., after execution of step S29). The temperature measured by the temperature detection part 26 decreases as indicated in FIG. 8.

An example of the operation flow in such a case will be described below with reference to FIG. 9 and FIG. 10. At step S2, the controller 14 receives the malfunction inspection command transmitted at the time when electric power supplied to the main motor is changed, and proceeds to step S3.

At step S21, the controller 14 controls the rotation number of the fan 22 from the regular rotation number $R_{Reg}$ to the rotation number $R_{Low}$. Specifically, the controller 14 sends a command to the inverter 36 so as to control electric power supplied from the inverter 36 to the fan motor 30 so that the rotation number of the rotor 32 is changed from the regular rotation number $R_{Reg}$ to the rotation number $R_{Low}$. Then, the controller 14 sequentially executes steps S22 to S24, similar to the operation flow of the above-mentioned example.

At step S25, the controller 14 calculates the degree of change in the temperature with respect to time. As an example, the controller 14 reads out from the storage part a first acquired temperature $T_1$ among the temperatures acquired from the temperature detection part 26 with the cycle A after the start of step S22.

Further, the controller 14 reads out from the storage part a temperature $T_n$ acquired just before or after the time point when determining "YES" at step S24. The controller 14 calculates a difference $\Delta T_n'$ between the temperature $T_1$ and the temperature $T_n$ (i.e., $\Delta T_n' = T_1 - T_n$). The difference $\Delta T_n'$ corresponds to the amount of decrease in the temperature within the time τ (i.e., the value of $T_{max} - T_{f4}$ in solid line 58 in FIG. 8).

In another example, at step S25, the controller 14 calculates a value corresponding to a gradient (time derivative coefficient) of the characteristic indicated by the solid line 58 in FIG. 8. Specifically, the controller 14 calculates the absolute value of a gradient $\delta T/\delta t = (T_n - T_{n-1})/A$, by the method similar to the flow of the above-mentioned example.

At step S26, the controller 14 determines whether or not the degree of change in the temperature with respect to time, which has been calculated at step S25, is different from a predetermined standard. In an example, if the difference $\Delta T_n'$ is calculated at step S25, the amount of decrease in the temperature at the time point $t_2 (=t_1+\tau)$ of the characteristic of the normal product as indicated by the chain line 56 in FIG. 8, i.e., the value: $\Delta T_{Ref}' = T_{max} - T_{n4}$, is pre-stored as a target value in the storage part.

The, the controller 14 calculates a ratio $R_2$ of the difference $\Delta T_n'$ to the target value $\Delta T_{Ref}'$, i.e., the ratio $R_2 = \Delta T_n'/\Delta T_{Ref}'$, and determines whether or not the ratio $R_2$ is less than a predetermined fifth threshold value. The target value $\Delta T_{Ref}'$ and the fifth threshold value can be obtained in advance by an experimental method or a simulation.

When the ratio $R_2$ is less than the fifth threshold value, the controller 14 determines that the degree of change in the temperature with respect to time is different from the degree of change of the normal product as the standard, as in the case of the characteristic indicated by the solid line 58 in FIG. 8.

In another example, the controller 14 calculates a difference $\Delta T_n'$ between the difference $\Delta T_n'$ and the target value $\Delta T_{Ref}'$, i.e., the difference $\delta T_n' = \Delta T_{Ref}' - \Delta T_n'$, and determines whether or not the difference $\delta T_n'$ is more than a predetermined sixth threshold value. The difference $\delta T_n'$ is a value corresponding to $\delta T_4$ indicated in FIG. 8.

When the difference $\delta T_n'$ is more than the sixth threshold value, the controller 14 determines that the degree of change in the temperature with respect to time is different from the degree of change of the normal product as the standard, as in the case of the characteristic indicated by the solid line 58 in FIG. 8.

In still another example, the controller 14 may determine whether the difference $\Delta T_n'$ is less than a predetermined seventh threshold value. In this case, the seventh threshold value is preset based on the target value $\Delta T_{Ref}'$ (i.e., the characteristic of chain line 56 in FIG. 8).

In still another example, if the absolute value of the gradient $\delta T/\delta t$ is calculated at step S25, an eighth threshold value relating to the absolute value of the gradient $\delta T/\delta t$ is pre-stored in the storage part. The eighth threshold value is set based on the gradient of the characteristic of the normal product as indicated by the chain line 56 in FIG. 8, and can be obtained in advance by an experimental method or a simulation.

When the absolute value of the gradient $\delta T/\delta t$ is less than the eighth threshold value, the controller 14 determines that the degree of change in the temperature with respect to time is different from the degree of change of the normal product as the standard, as in the case of the characteristic indicated by the solid line 58 in FIG. 8.

When the controller 14 determines that the degree of change in the temperature with respect to time is different from the standard (i.e., determines "YES"), it proceeds to step S27. On the other hand, when the controller 14 determines that the degree of change in the temperature with respect to time is the same as the standard (i.e., determines "NO"), the controller 14 proceeds to step S29. Then, the controller 14 executes steps S27 to S29, and S4, similar to the operation flow of the above-mentioned example.

Figure 12:
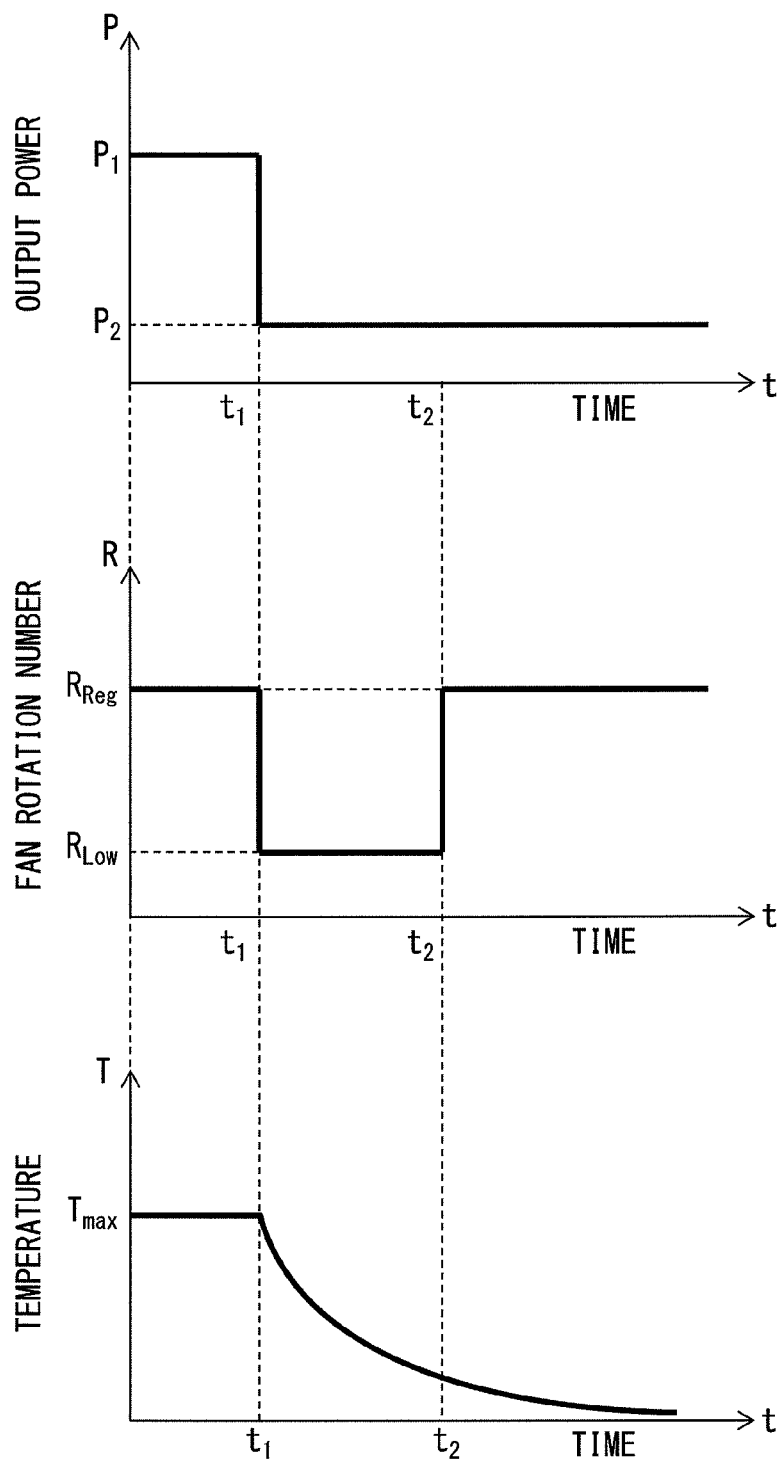
FIG. 12 is a timing chart of the output power of the motor drive device, the rotation number of the fan, and the temperature change, when executing the operation flow according to another example.

The timing chart of each of output power P from the motor drive device 10 to the main motor, the rotation number R of the fan 22, and the temperature T measured by the temperature detection part 26 in the operation flow of this example is shown in FIG. 12.

At the time point $t_1$, the controller 14 changes electric power supplied to the main motor from regular electric power $P_1$ to lower power $P_2$ (which may be zero) than the regular electric power $P_1$. At this time, a malfunction inspection command is transmitted to the controller 14, and the controller 14 receives the malfunction inspection command and decreases the rotation number of the fan 22 from the regular rotation number $R_{Reg}$ to the rotation number $R_{Low}$ (step S21). After the time point $t_1$, the temperature measured by the temperature detection part 26 decreases.

At the time point $t_2$, the controller 14 increases the rotation number of the fan 22 from the rotation number $R_{Low}$ to the regular rotation number $R_{Reg}$ again (step S29). Then, the controller 14 executes step S1 until it determines "YES" at step S4.

As described above, the motor drive device 10 according to this embodiment detects the occurrence of a malfunction in airflow in the flow paths 30 of the heat sink 20 based on the degree of change in the temperature measured by the temperature detection part 26 with respect to time, and automatically notifies a user of the occurrence. Therefore, the user can automatically and reliably recognize the need for the maintenance of removing foreign substances in the flow paths 30.

Further, the motor drive device 10 calculates the degree of change in the temperature with respect to time with controlling the rotation number of the fan 22 to the rotation number $R_{Low}$ lower than the regular rotation number $R_{Reg}$, and determines whether or not the degree of change in the temperature is different from the standard.

As described above with reference to FIG. 6 and FIG. 8, the lower rotation number of the fan 22 results in the significant difference between the degrees of change in the temperature of the normal product and the malfunction product in a short time. Therefore, according to this embodiment, it is possible to detect the occurrence of the malfunction in the airflow in the flow paths 30 of the heat sink 20 with higher precision, even when the temperature considerably changes in a short time.

Note that, the heating element 24 may be indirectly mounted on the heat sink 20 via another member comprised of e.g. a heat transfer material. Alternatively, the heating element 24 may be mounted on any element other than the heat sink 20 which constitutes the motor drive device 10.

Similarly, the temperature detection part 26 may be indirectly mounted on the heat sink 20 via another member comprised of e.g. a heat transfer material. Alternatively, the temperature detection part 26 may be mounted on any element other than the heat sink 20 which constitutes the motor drive device 10.

Further, in the example shown in FIG. 11, the output power P is increased from zero to the regular electric power $P_1$ at the time point $t_1$ at which the malfunction inspection command is transmitted to the controller 14. However, the malfunction inspection command may be transmitted to the controller 14 at the time when the output power P of the motor drive device 10 is changed from predetermined power $P_a$ to power $P_b$ which is different from the power $P_a$.

The invention is described above referring to the embodiments of the invention. However, the invention according to claims is not limited by the embodiments described above. Although embodiments in which the features described in the embodiments of the invention are combined can fall within the technical scope of the invention, all the combinations of the features are not needed for the solution of the invention. Furthermore, it is apparent to those skilled in the art that various changes or modifications of the embodiments described above can be made.

It should be noted that the order of execution of each treatment of the operations, procedures, steps, processes, stages, and the like in the devices, systems, programs, and methods described in the claims, the specification, and the drawings can be optionally achieved unless the order is otherwise specified by "before", "prior to", or the like, and unless the power of prior treatment is used in the following treatment. Explanation of each operation flow in the claims, the specification, and the drawings using "first", "next", "then", or the like for convenience does not mean that the operation flow is necessarily carried out in this order.

The invention claimed is:

1. A motor drive device comprising:
   a heat sink including a flow path for a fluid;
   a fan which causes the fluid to flow in the flow path;
   a fan controller which controls a rotation number of the fan, the controller being configured to;
     control the rotation number of the fan from a regular rotation number predetermined as a required value when driving a motor to a first rotation number lower than the regular rotation number; or
     control the rotation number of the fan from a second rotation number lower than the first rotation number to the first rotation number;
   a temperature detection part which detects a temperature of the motor drive device;
   a temperature change calculating part which calculates a degree of change in the temperature with respect to time when the fan controller controls the rotation number of the fan to the first rotation;
   a malfunction determination part which determines whether the degree of change calculated by the temperature change calculating part is different from a predetermined standard; and
   a malfunction signal generation part which generates a signal indicating that a malfunction occurs in the fluid flow in the flow path when the malfunction determination part determines that the degree of change is different from the standard.

2. The motor drive device according to claim 1, wherein, as the degree of change, the temperature change calculating part calculates an amount of change in the temperature within a predetermined period when the rotation number of the fan is controlled to the lower rotation number, and wherein
   the malfunction determination part determines that the degree of change is different from the standard when the calculated amount of change is less than a predetermined threshold value.

3. The motor drive device according to claim 1, wherein, as the degree of change, the temperature change calculating part calculates an amount of change in the temperature within a predetermined period when the rotation number of the fan is controlled to the lower rotation number, and wherein
   the malfunction determination part determines that the degree of change is different from the standard when a ratio of the calculated amount of change to a predetermined target value of the amount of change in the temperature is less than a predetermined threshold value.

4. The motor drive device according to claim 1, wherein, as the degree of change, the temperature change calculating part calculates an amount of change in the temperature within a predetermined period when the rotation number of the fan is controlled to the lower rotation number, and wherein
   the malfunction determination part determines that the degree of change is different from the standard when a difference between the calculated amount of change and a predetermined target value of the amount of change in the temperature is larger than a predetermined threshold value.

5. The motor drive device according to claim 1, further comprising an alarm output part which receives the signal and outputs an alarm to a user.

6. A method of notifying a user of a malfunction in a fluid flow in a flow path formed at a heat sink provided in a motor drive device, the method comprising:
   controlling a rotation number of a fan which causes a fluid to flow in the flow path from a regular rotation number predetermined as a required value when driving a motor to a first rotation number lower than the regular rotation number, or controlling the rotation number of the fan from a second rotation number lower than the first rotation number to the first rotation number;
   detecting a temperature of the motor drive device;
   calculating a degree of change in the temperature with respect to time when the rotation number of the fan is controlled to the first rotation number;
   determining whether the calculated degree of change is different from a predetermined standard; and
   notifying a user that a malfunction occurs in the fluid flow in the flow path when it is determined that the degree of the change is different from the standard.

* * * * *